(12) United States Patent
Gollmer et al.

(10) Patent No.: US 7,574,643 B2
(45) Date of Patent: Aug. 11, 2009

(54) TEST APPARATUS AND METHOD FOR TESTING A CIRCUIT UNIT

(75) Inventors: Stefan Gollmer, München (DE);
Carsten Ohlhoff, Dresden (DE);
Hans-Christoph Ostendorf, Neubiberg (DE)

(73) Assignee: Infineon Technologies AG, Munich (DE)

( * ) Notice: Subject to any disclaimer, the term of this patent is extended or adjusted under 35 U.S.C. 154(b) by 444 days.

(21) Appl. No.: 11/356,713

(22) Filed: Feb. 17, 2006

(65) Prior Publication Data

US 2006/0202706 A1 Sep. 14, 2006

(30) Foreign Application Priority Data

Feb. 18, 2005 (DE) .................... 10 2005 007 580

(51) Int. Cl.
*G01R 31/28* (2006.01)

(52) U.S. Cl. ........................... 714/733; 714/30

(58) Field of Classification Search ................. 324/765; 714/724, 740, 733, 726, 729, 30
See application file for complete search history.

(56) References Cited

U.S. PATENT DOCUMENTS

| | | | | |
|---|---|---|---|---|
| 4,972,413 A * | 11/1990 | Littlebury et al. | ............ | 714/724 |
| 5,371,748 A * | 12/1994 | Saw et al. | .................... | 714/740 |
| 5,517,515 A * | 5/1996 | Spall et al. | .................... | 714/733 |
| 6,732,304 B1 | 5/2004 | Ong | | |
| 6,882,171 B2 * | 4/2005 | Ong | ............................ | 324/765 |
| 6,898,747 B2 | 5/2005 | Finteis | | |
| 7,143,324 B2 * | 11/2006 | Bratt et al. | .................... | 714/726 |
| 7,309,999 B2 * | 12/2007 | Ong | ............................ | 324/765 |

FOREIGN PATENT DOCUMENTS

DE         101 43 455 A1    4/2003

* cited by examiner

*Primary Examiner*—David Ton
(74) *Attorney, Agent, or Firm*—Maginot, Moore & Beck

(57) ABSTRACT

In a method for testing an electric circuit comprising circuit subunits, the electric circuit is connected to a test system via a tester channel with a connection unit. The tester channel is connected to the circuit subunits by means of a connecting unit, test signals are generated for the electric circuit and response signals generated by the electric circuit in response to the test signals are evaluated. The test signals and the response signals are interchanged between the circuit subunits by means of at least one compression/decompression unit associated with at least one of the circuit subunits.

8 Claims, 6 Drawing Sheets

TEST APPARATUS AND METHOD FOR TESTING A CIRCUIT UNIT

BACKGROUND OF THE INVENTION

1. Field of the Invention

The present invention relates, in general, to test systems for testing circuits having a number of circuit subunits or chips in a multichip housing. The present invention relates, in particular, to a test apparatus in which a test system is connected to the circuit unit to be tested, it being possible to test the circuit subunits which are associated with the circuit unit to be tested without having to provide an increased number of connection pins.

2. Description of the Related Art

The present invention relates specifically to a test apparatus for testing a circuit unit which is to be tested and has circuit subunits, said test apparatus having a test system for outputting test signals to the circuit unit to be tested and for evaluating response signals which are output from the circuit unit to be tested on the basis of the test signals supplied to the latter, a tester channel for connecting the circuit unit to be tested to the test system, and a connecting unit which is intended to connect the tester channel to the circuit subunits of the circuit unit to be tested.

In large-scale integrated circuit units, for example integrated memory circuits (dies), which are provided as a module in the form of a so-called multichip housing (multichip package, MCP), it must be possible to test the overall module after it has been housed. The final test is extremely complex since circuit subunits having very different functionalities and test requirements are typically combined in an MCP.

There is thus the disadvantage that a large number of external contacts need to be provided in order to connect the test system to the different circuit subunits of a circuit unit which is to be tested and is designed as a multichip package.

Such a large number of connecting contacts inexpediently requires a correspondingly large number of contacts on the test system. This results in the disadvantage that the number of circuit units which can be tested in parallel is reduced. This results in the test costs being increased and/or in the test time being extended. Another disadvantage of conventional test methods resides in the fact that no standard set of test functionalities can be provided since the circuit subunits in a multichip housing may be fabricated by different semiconductor manufacturers.

SUMMARY OF THE INVENTION

It is an object of the present invention to provide a test apparatus or a test method for testing a circuit unit which is to be tested and has circuit subunits, in which apparatus and method the number of circuit units to be tested which can be tested in parallel is increased without increasing the number of external contacts of the multichip housing. The present invention is intended to limit the number of tester channels required without having to dispense with testing—which is as complete as possible—of the circuit subunits which are accommodated in the multichip housing.

The object is achieved in accordance with the invention by means of a inventive test apparatus for testing at least one circuit unit which is to be tested and has circuit subunits, comprising:

a) a test system for outputting test signals to the at least one circuit unit to be tested and for evaluating response signals which are output from the circuit unit to be tested on the basis of the test signals supplied to the latter;

b) a tester channel for connecting the at least one circuit unit to be tested to the test system; and c) a connecting unit which is intended to connect the tester channel to the circuit subunits of the circuit unit to be tested, the circuit subunits having compression/decompression units which provide for the interchange of test signals and response signals between the circuit subunits of the circuit unit to be tested.

The object is also achieved in accordance with the invention by means of a method for testing a circuit unit which is to be tested and has circuit subunits, comprising the steps of:

a) using at least one connection unit to connect the circuit unit to be tested to a test system via a tester channel;

b) using a connecting unit to connect the tester channel to the circuit subunits of the circuit unit to be tested;

c) outputting test signals to the circuit unit to be tested; and d) evaluating response signals which are output from the circuit unit to be tested on the basis of the test signals supplied to the latter, compression/decompression units which are respectively associated with the circuit subunits being used to provide for the interchange of test signals and response signals between the circuit subunits of the circuit unit to be tested.

A fundamental concept of the invention is to interchange test signals, which are supplied to circuit subunits, and response signals, which are output from the latter, from circuit subunit to circuit subunit within the circuit units to be tested and, only after the circuit subunits which are accommodated in the circuit unit to be tested have been tested, to send a result signal (overall response signal) to the test system which is connected via a tester channel.

A compression/decompression unit which makes it possible to interchange test signals and response signals between the circuit subunits of the circuit unit to be tested is advantageously respectively associated with the circuit subunits of the circuit unit to be tested.

It is thus an advantage of the present invention that a prescribed number of circuit subunits can be tested in a circuit unit to be tested without having to increase the number of connection pins of the circuit unit to be tested for the purpose of completely testing the circuit subunits.

The circuit subunits of the circuit unit to be tested may be arranged in a common housing or a multichip housing. The common housing may advantageously comprise a multichip package.

In a restricted version of the inventive apparatus or method, the test signals which are supplied by the test system to a circuit subunit of the circuit unit to be tested are decompressed in the compression/decompression unit. It is also possible for the response signals which are output from a circuit subunit of the circuit unit to be tested and are supplied to the test system to be compressed in the compression/decompression unit. This makes it possible for all of the circuit subunits which are accommodated in a common housing and form the circuit unit to be tested to be tested comprehensively without having to increase the number of connection pins needed to connect the circuit unit to be tested to a test system via tester channels.

DESCRIPTION OF THE PREFERRED EMBODIMENTS

In the figures, identical reference symbols denote identical or functionally identical components or steps.

The fundamental principle of the invention is that circuit subunits which are arranged in a circuit unit to be tested can be efficiently tested by providing compression/decompression units in the circuit unit to be tested, said compression/decompression units being associated with the circuit subunits and providing for the interchange of test signals and response signals between the circuit subunits of the circuit unit to be tested.

This makes it possible for the circuit subunits which are arranged in a multichip housing that finally forms the circuit unit to be tested to interchange test and response signals before overall response signals are returned to the connected test system.

Figure 1:
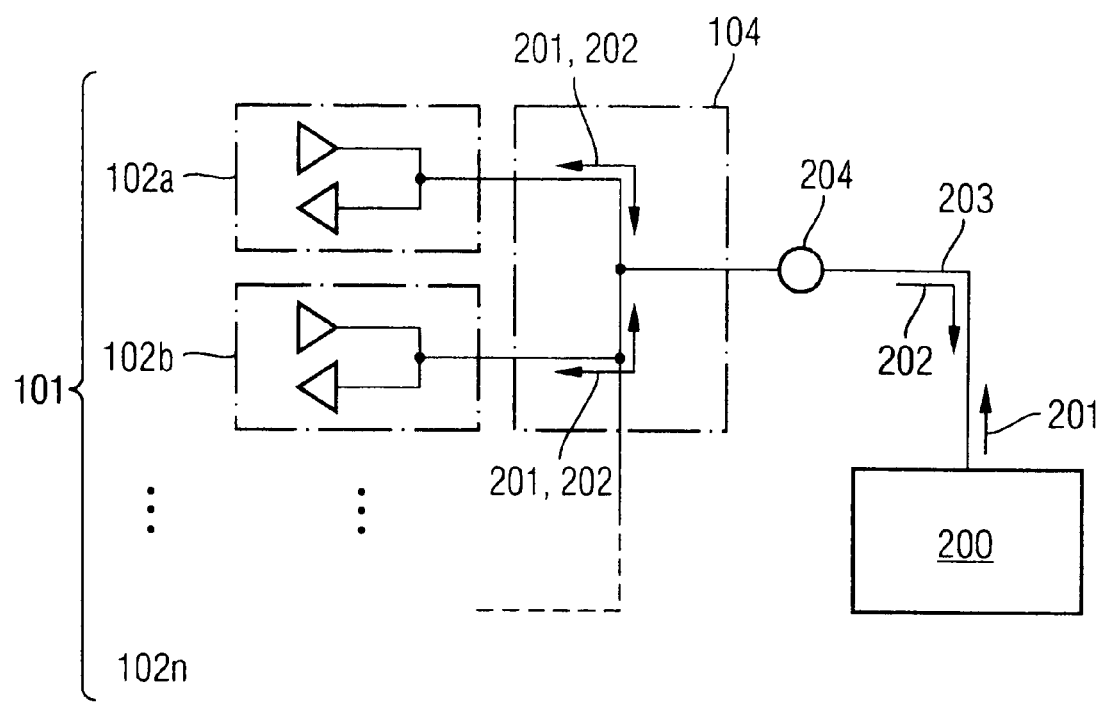
FIG. 1 is a diagrammatic illustration of a circuit unit which is to be tested and is connected to a test system.

FIG. 1 diagrammatically shows a basic block diagram of the inventive test apparatus. The latter comprises a test system 200 which can emit test signals 201 to the circuit unit 101 to be tested and can analyse or evaluate response signals 202 which are output from the circuit unit to be tested on the basis of the test signals 201 supplied to the latter. For this purpose, the test system 200 is connected, via a tester channel 203, to the circuit unit 101 to be tested.

To this end, the circuit unit 101 to be tested is connected to the tester channel 203 by means of a connection unit 204. Two circuit subunits 102a, 102b are shown, by way of example, in FIG. 1. It shall be pointed out that any desired number of n circuit subunits may be accommodated in a multichip housing, depending on the requirements of an application. The fundamental concept of the invention is to use the test system 200 to reliably test all of the number n of circuit subunits 102a-102n as regards different functionalities without having to provide a correspondingly large number of connection pins or connecting lines to the test system, as would be necessary if the circuit subunits 102a-102n of the circuit unit 101 to be tested had to be tested individually and in parallel.

Figure 2:
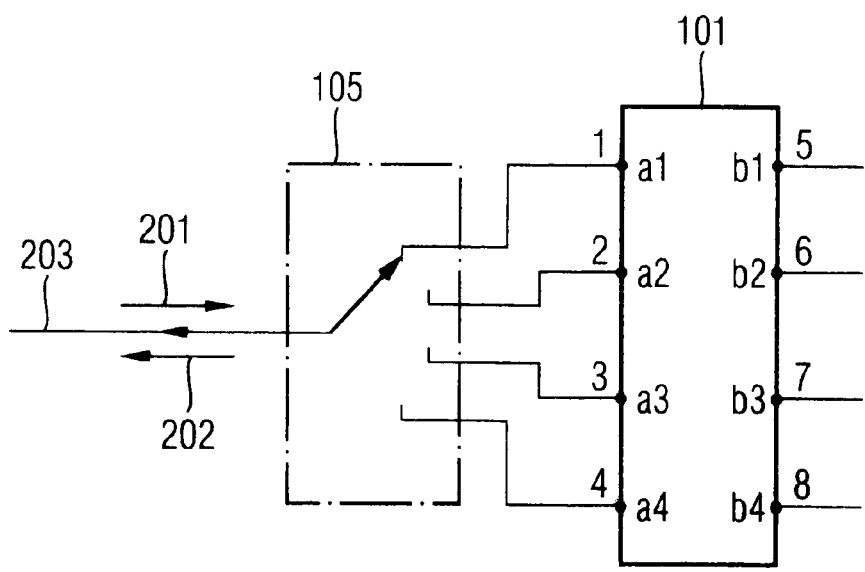
FIG. 2 is a circuit subunit which is to be tested using the test system of FIG. 1 and is connected to a tester channel via a selection unit which is in the form of a relay matrix.

In order to bring individual test signals 201, which trigger response signals 202 that are returned by the circuit subunit 102a-102n to be tested, to the individual contact points of the circuit subunit 102, a selection unit 105 is provided, as is shown in FIG. 2. The selection unit 105 forwards the test signals 201 to different connection units a1, a2, a3, a4 of the circuit unit 101. This arrangement results in a reduction in the number of channels needed for bidirectional data lines.

Figure 3:
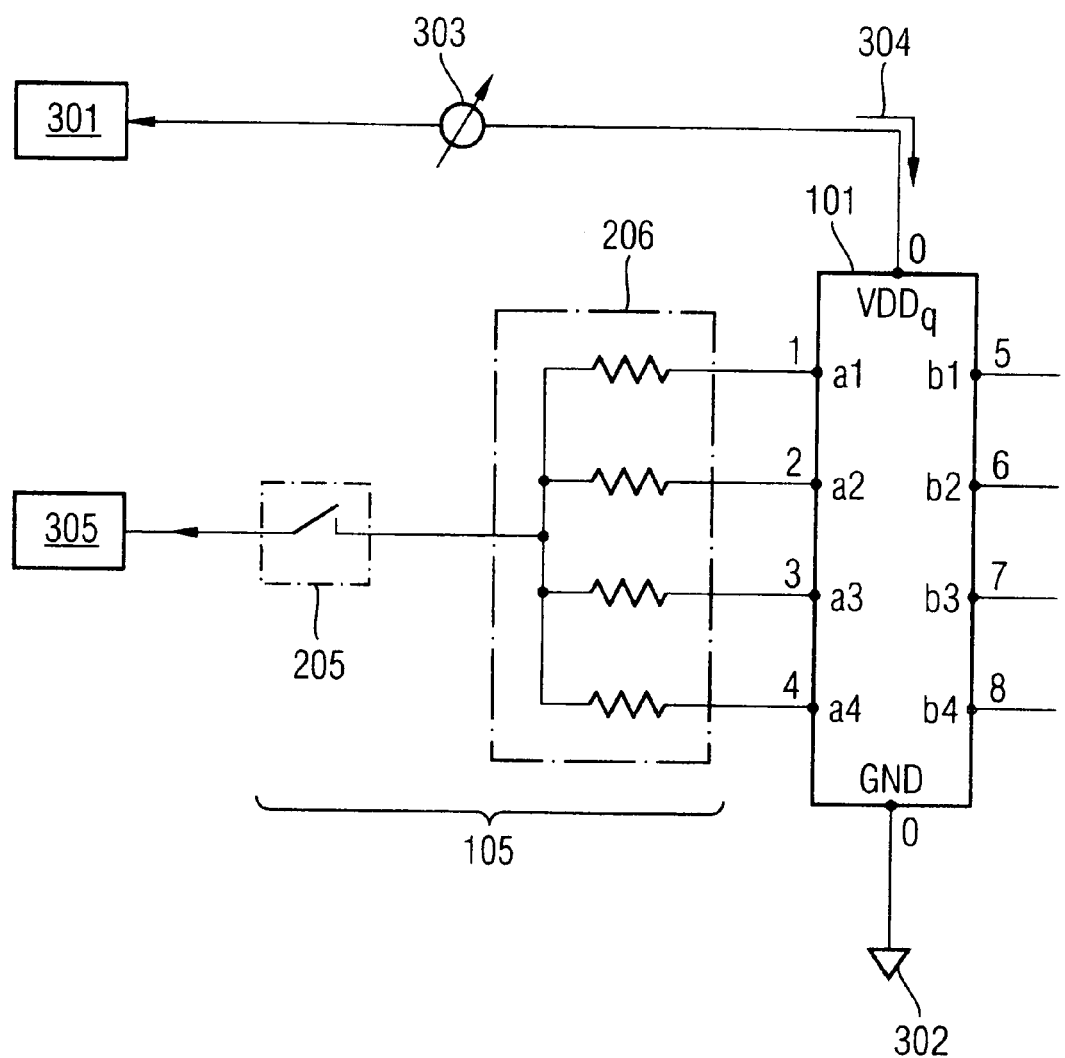
FIG. 3 is a further exemplary selection unit.
Figure 4A:
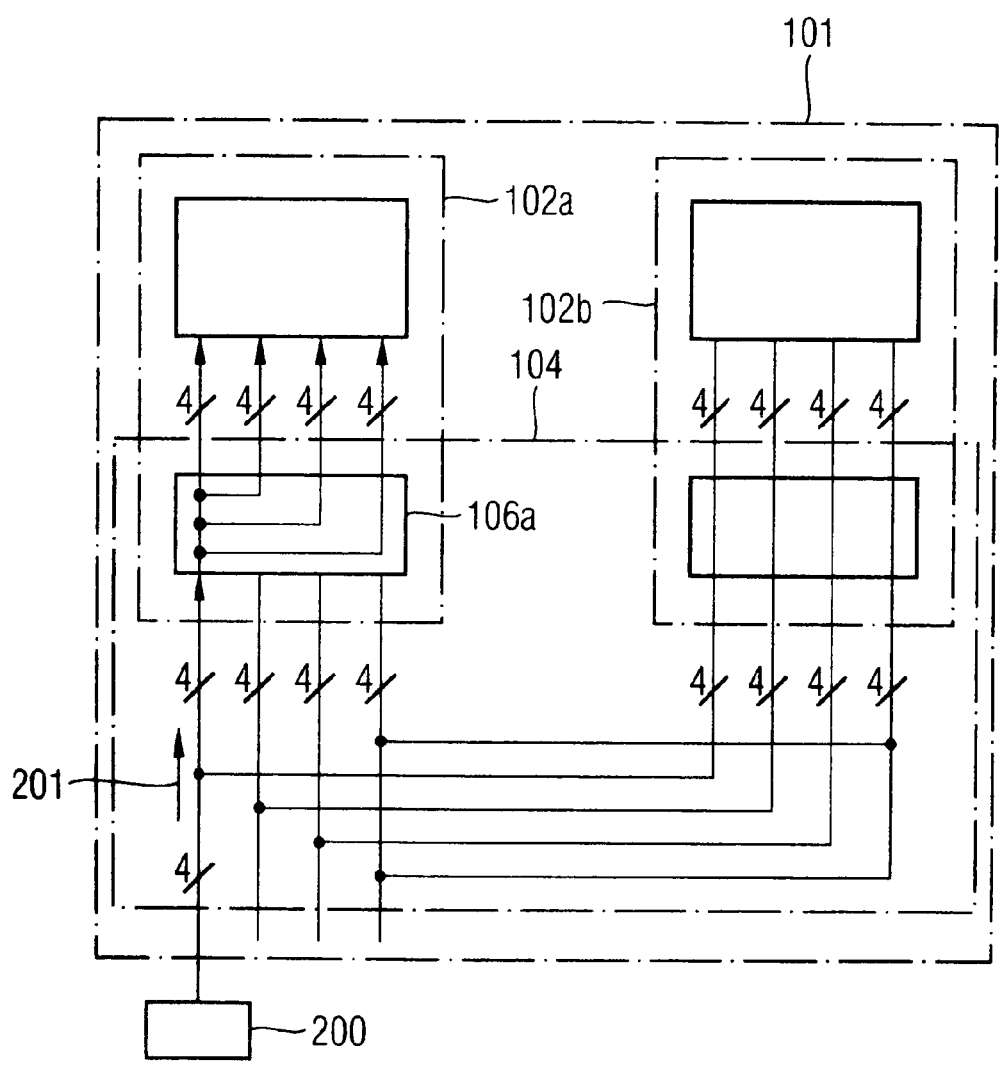
FIG. 4(a) shows the step of supplying test signals to a first circuit subunit of the circuit unit.
Figure 4B:
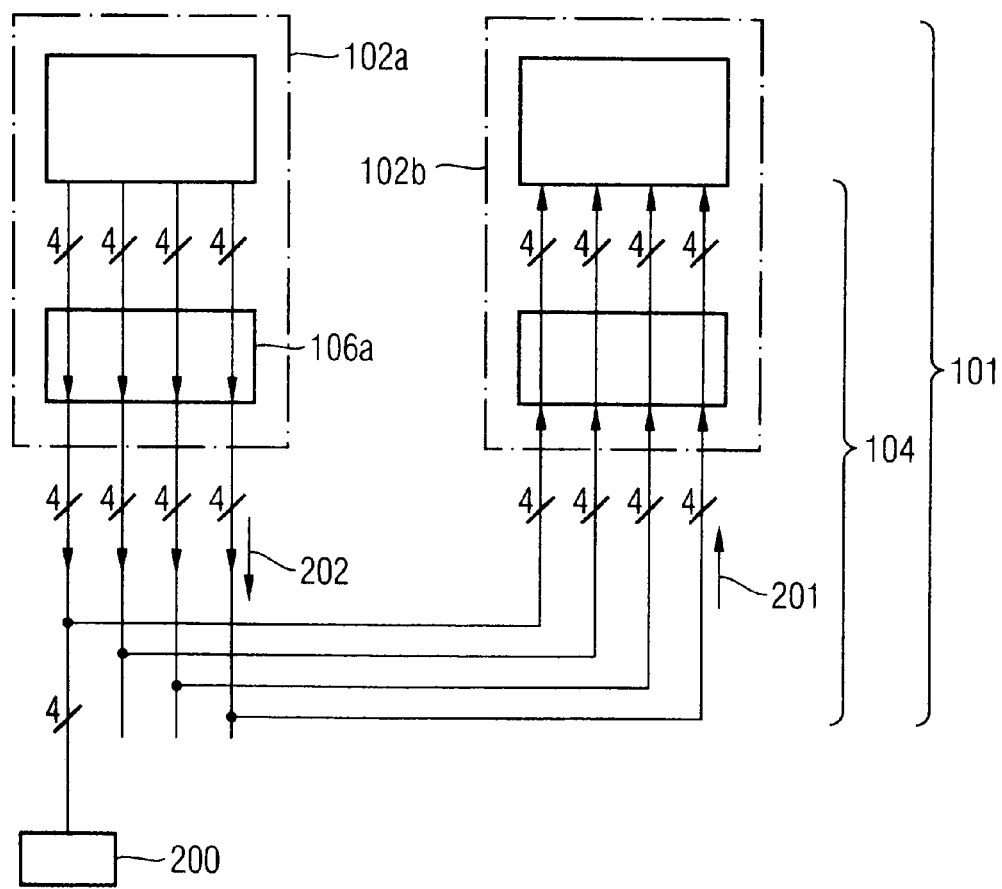
FIG. 4(b) shows the operation of outputting response signals from the first circuit subunit to a second circuit subunit of the circuit unit.
Figure 5A:
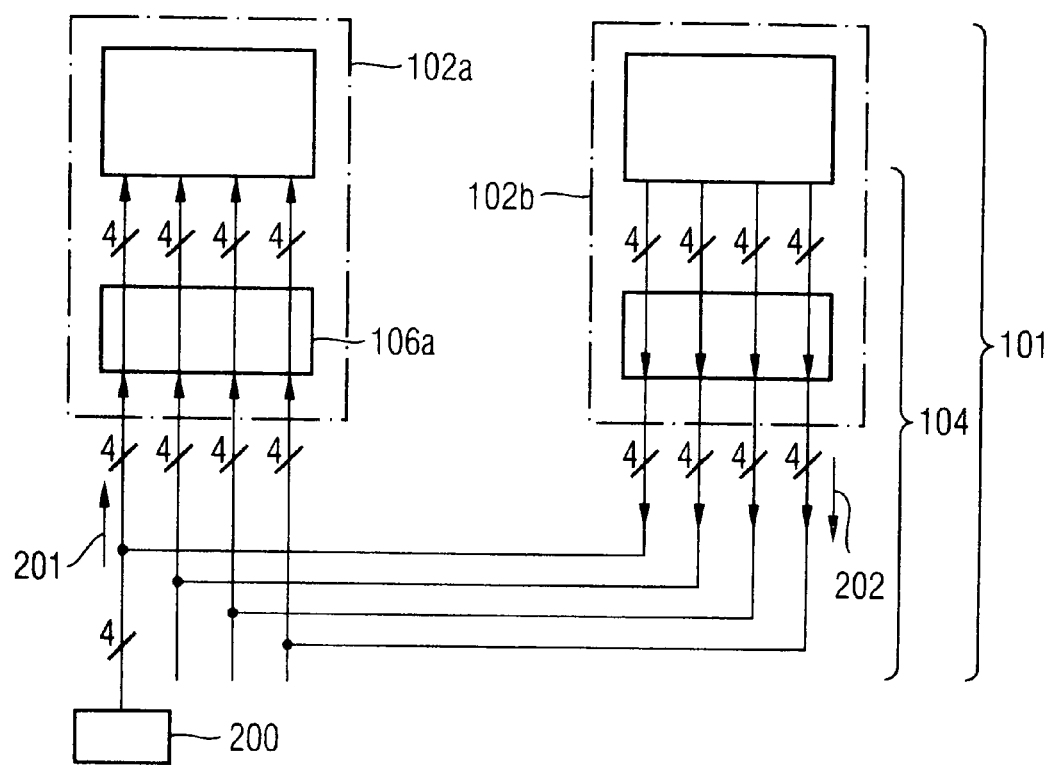
FIG. 5(a) shows the operation of outputting response signals from the second circuit subunit to the first circuit subunit and supplying them to the first circuit subunit of the circuit unit.
Figure 5B:
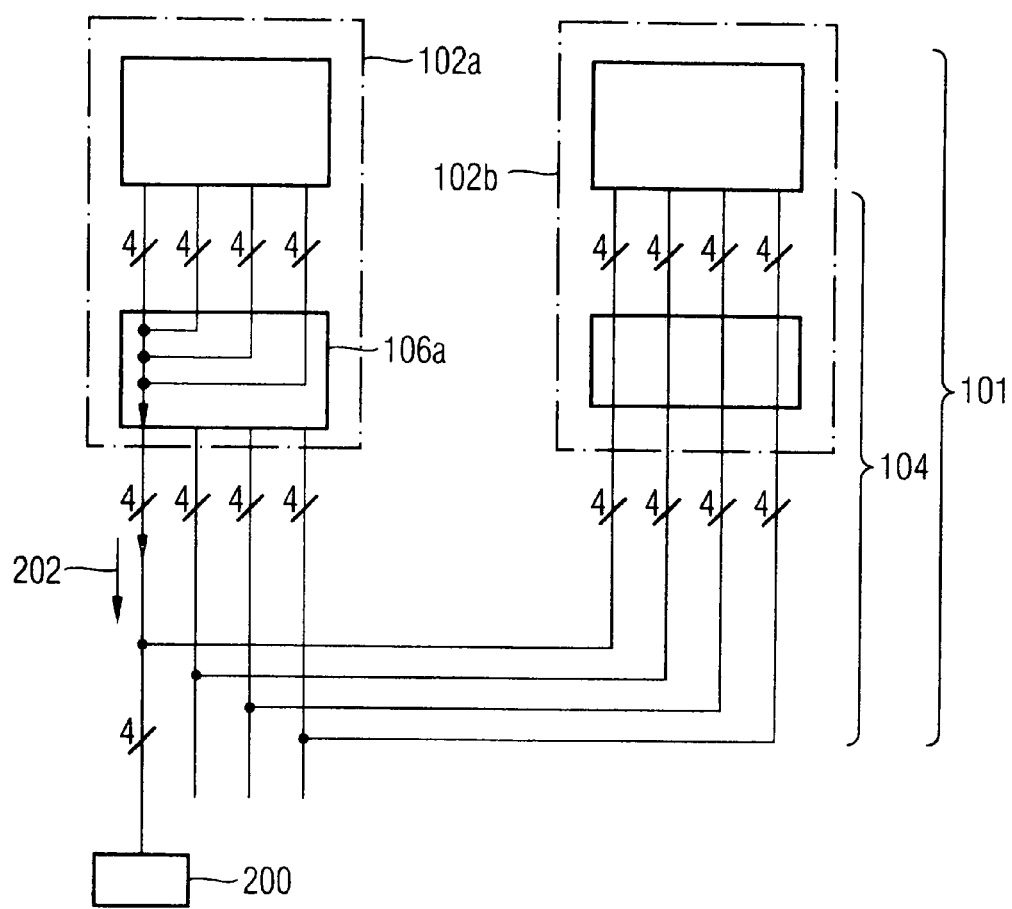
FIG. 5(b) shows the operation of outputting response signals from the first circuit subunit of the circuit unit.

In addition to the so-called relay matrix which is shown in FIG. 2 and is used to form the selection unit 105, the resistance matrix 206 which is shown in FIG. 3 and is connected in series with a switching unit 205 (which may be in the form of a relay) is also suitable. In this case, the switching unit 205 is connected, on the one hand, to a tester energy supply unit 305 and, on the other hand, to the input connection of the resistance matrix 206. Closing the relay causes contact and leakage current tests, for example, to be carried out, while, when the relay is opened, functional tests can be carried out on the circuit unit 101 to be tested.

The circuit subunit 102 to be tested is connected, via a current detection unit 303 which detects a supply current 304, to an energy supply unit 301, on the one hand, and to earth 302, on the other hand.

The inventive method which avoids all of the connection pins of each circuit subunit 102a-102n of the circuit unit 101 to be tested having to be connected to the test system 200 will be explained below with reference to FIGS. 4(a), 4(b), 5(a) and 5(b). Only two circuit subunits 102a, 102b with an associated compression/decompression unit 106a are respectively shown in order to explain the principle of the inventive method.

The inventive method advantageously avoids the provision of an associated tester for each type of circuit subunit 102a-102n, that is to say universal use of test systems 200 is ensured by the inventive method.

It is thus possible to completely test a circuit unit 101 which is to be tested and is designed as a multichip package. The inventive test method for testing a circuit unit 101 which is to be tested and has circuit subunits 102a-102n is based on the fact that data lines or I/O lines of the different circuit subunits 102a-102n of a circuit unit to be tested are internally connected together and are routed to outside the multichip housing (of the circuit unit 101 to be tested) in the form of a contact connection.

It shall be pointed out that, although the following explanations relate to such I/O lines, the invention is not restricted to I/O lines but rather may include all signal lines. As explained above in FIG. 1, the connecting unit 104 results in the possibility of interchanging data between the circuit subunits 102a, 102b of the circuit unit 101 to be tested.

The test contents when are relevant when testing the circuit unit 101 to be tested are discussed in more detail below. Such test contents include, inter alia:

(a) contact and leakage current tests; and
(b) functional tests for checking internal functionalities of the circuit subunits 102a-102n.

When carrying out contact and leakage current tests (a), it must be ensured that all of the connection pins of a circuit subunit 102a-102n to be tested are tested, that is to say the contact and leakage current test must be carried out at least once after housing and must include all of the connection pins of the circuit subunit 102a-102n.

It shall be pointed out that such a contact test of I/O signals using the internal interchange of signals within the multichip housing is not sufficient since the contact test must additionally ensure that I/O signals are satisfactorily transferred to an external connection of the multichip housing. This is the case only when a connection is provided from outside the multichip housing. That is to say, even in the case of the inventive method which reduces the number of connected I/O channels, it must nevertheless be ensured that the contact/leakage current tests are carried out on all of the connection pins of the circuit subunits 102a-102n to be tested. The contact and leakage current tests are a direct current measurement which imposes minor demands on the timing accuracy. This makes it possible to provide the relay matrix (shown in FIG. 2) in the form of a selection unit 105 which forwards I/O signals to connections of the circuit subunits 102a-102n which do not have to be connected to the tester for functional tests.

During a functional test, mutually testing the circuit subunits 102a-102n of the circuit unit 101 to be tested makes it possible to considerably increase parallelism. In this case, it is assumed that at least one circuit subunit 102a-102n to be tested can be written to using an I/O compression mode and additionally has an inversion capability which can be externally controlled. By way of example, the circuit unit 101 to be tested may have sixteen I/O connections, a first circuit subunit 102*a* to be tested being operated and read from in a 16:4 compression mode. Four I/O signal lines are thus connected to a tester, and the circuit would be operated as follows:

(i) The associated first compression/decompression unit 106*a* is used to write to a first circuit subunit 102*a* in a 4:1 decompression mode in such a manner that the first circuit subunit 102*a* receives the defined test signals 201, as shown in FIG. 4(*a*).

(ii) A circuit subunit 102*a* is changed over to the uncompressed mode, and the data (response signals 202) from the first circuit subunit 102*a* are then written to a second circuit subunit 102*b*. That is to say the response signals from the first circuit subunit 102*a* are supplied to the second circuit subunit 102*b* as test signals, as shown by the step illustrated in FIG. 4(*b*).

(iii) As shown in FIG. 5(*a*), the data from the circuit subunit 102*b* are then written back, in inverted fashion, to the circuit subunit 102*a*, that is to say the data which are inverted with respect to step (i) above should now be present in the circuit subunit 102*a*.

Finally, as illustrated in FIG. 5(*b*), the first compression/decompression unit 106*a* provides a 16:4 compression mode which reads the response data 202 from the first circuit subunit 102*a* and supplies them to the test system 200 as overall response data.

It shall be pointed out that the circuit subunits 102*a*-102*n* (to be tested) of the circuit unit 101 to be tested are preferably memory modules. Although only two circuit subunits 102*a*, 102*b* are described with reference to FIGS. 4(*a*) to 5(*b*), any desired number n of circuit subunits 102*a*-102*n* can be accommodated and tested in a multichip housing.

It is thus possible to use the principle of mutually testing the read and write functionality of different circuit subunits 102*a*-102*n* with jointly used I/O lines without the test system 200 having to redefine test signals (test data) 201 in each step. Another advantage resides in using an I/O compression functionality of a circuit subunit 102*a*-102*n* to be tested within the circuit unit 101 to be tested to test the other circuit subunits 102*a*-102*n* in which no compression functionality is available or in which the user cannot discern said compression functionality.

A complete direct current test on all of the connection pins of the multichip housing is preferably effected by a selection unit 105 which is in the form of a relay matrix. The inventive method thus allows the number of connected bidirectional I/O connection pins to be reduced without restricting the functionality, the scope or the parallelism of the test by the test system 200.

Before the test signals 201 are supplied to the circuit subunit 102*a* to be tested (as illustrated in FIG. 4(*a*)), this test signal 201 must be decompressed by 4:16 in the example illustrated. The advantage of this inventive test method is based, in particular, on the fact that, when writing data from one circuit subunit 102*a* to another circuit subunit 102*b* or when interchanging data between different circuit subunits 102*a*-102*n* of the circuit unit 101 to be tested, there is no need to provide for communication of the I/O signals with the test system 200 via the tester channel 203.

Although modifications and changes may be suggested by those skilled in the art, it is the intention of the inventors to embody within the patent warranted heron all changes and modifications as reasonably and properly come within the scope of their contribution to the art.

We claim as our invention:

1. A test apparatus for testing an electric circuit, comprising:
    a test system for generating test signals and for evaluating response signals which an electric circuit generates in response to said test signals;
    a tester channel for connecting said electric circuit to said test system;
    said electric circuit comprising a plurality of circuit subunits and a connecting unit being arranged in said electric circuit for connecting said tester channel to said circuit subunits and at least one of said circuit subunits comprising a compression/decompression unit for interchanging said test signals and said response signals between said circuit subunits.

2. The apparatus of claim 1, wherein said circuit subunits are arranged in a common housing.

3. The apparatus of claim 2, wherein said common housing is designed as a multichip package.

4. The apparatus of claim 1, wherein said compression/decompression unit is a 4:16 decompression unit.

5. The apparatus of claim 1, wherein said compression/decompression unit is a 16:4 compression unit.

6. A method for testing an electric circuit, comprising the steps of:
    Connecting an electric circuit to a test system via a tester channel with a connection unit; said electric circuit comprising circuit subunits;
    connecting said tester channel to said circuit subunits by means of a connecting unit;
    generating test signals for said electric circuit; and
    evaluating response signals generated by said electric circuit in response to said test signals; and
    interchanging said test signals and said response signals between said circuit subunits by means of at least one compression/decompression unit associated with at least one of said circuit subunits.

7. The method of claim 6, comprising compressing said test signals supplied by said test system to one of said circuit subunits in said compression/decompression unit.

8. The method of claim 6, comprising compressing said response signals output by one of said circuit subunits and supplied to said test system in said compression/decompression unit.

* * * * *